United States Patent [19]

Makihara et al.

[11] Patent Number: 5,036,646
[45] Date of Patent: Aug. 6, 1991

[54] METHOD OF PACKAGING AN INTEGRATED CIRCUIT IN AN INERT GAS

[75] Inventors: Masayuki Makihara; Toshirou Ryuno; Mitsunobu Fujita; Osamu Narimatsu; Toshiyuki Konishi, all of Nagoya, Japan

[73] Assignee: Mitsui Toatsu Chemicals, Inc., Tokyo, Japan

[21] Appl. No.: 349,756

[22] Filed: May 10, 1989

[30] Foreign Application Priority Data

May 17, 1988 [JP] Japan .............................. 63-118361
Apr. 12, 1989 [JP] Japan .............................. 63-90832

[51] Int. Cl.⁵ ...................... B65B 31/02; B65B 25/00
[52] U.S. Cl. ......................................... 53/432; 53/478
[58] Field of Search .............. 53/432, 433, 449, 467, 53/471, 472, 478

[56] References Cited

U.S. PATENT DOCUMENTS

| | | |
|---|---|---|
| D. 248,215 | 6/1978 | Cherry ................................ D9/418 |
| 3,756,399 | 9/1973 | Cosier et al. ........................ 53/449 X |
| 3,783,089 | 1/1974 | Hurst et al. ......................... 53/478 X |
| 3,910,410 | 10/1975 | Shaw ................................. 53/478 X |
| 4,063,349 | 12/1977 | Passler et al. ...................... 53/432 X |
| 4,409,252 | 10/1983 | Buschkens et al. ................ 53/432 X |
| 4,693,056 | 9/1987 | Raszewski ......................... 53/472 X |
| 4,867,336 | 9/1989 | Stewart ............................. 53/478 X |

*Primary Examiner*—Horace M. Culver
*Attorney, Agent, or Firm*—Burns, Doane, Swecker & Mathis

[57] ABSTRACT

The present invention relates to a container for an integrated circuit wafer comprising a tray-shaped member having a recess and a complimentary sheet member sized to attach to and cover said recess, at least one of said members being made from a material selected from the group consisting of a single layer of a high nitrile resin, and a laminated layer of a high nitrile resin, a polyvinylidene chloride resin, an ethylene vinyl alcohol copolymer or a polyvinyl alcohol resin, and a method for storing the wafer.

7 Claims, 1 Drawing Sheet

METHOD OF PACKAGING AN INTEGRATED CIRCUIT IN AN INERT GAS

BACKGROUND OF THE INVENTION a) Field of the Invention

The present invention relates to a container for an integrated circuit wafer. More particularly, the invention relates to a container that imparts excellent antioxidant properties to an integrated circuit wafer and lowers the generation of dust.

b) Description of the Prior Art

Containers presently used for the storage and transportation of wafers for integrated circuits (hereinafter abbreviated as IC-wafer) are prepared from resins such as polyethylene, polypropylene and rigid polyvinyl chloride. The IC-wafer is encased in a molded box and covered with a separately produced lid. Japanese Patent Publication No. KOKOKU Sho 61-46970(1986) discloses an encasing package consisting of a metal film into which an IC-wafer is placed, which is covered with a rigid plastic such as rigid polyvinyl chloride film.

Japanese Utility Model Laid-Open No. 112146/1987 describes an encasing box for an IC-wafer that is equipped with a ventilation device that provides a dust-proofing function.

These patents and the above model also disclosed storing an IC-wafer in an environment of inert gases such as nitrogen.

Surface oxidation of the wafer has been a serious problem with the use of the presently available containers. Oxygen penetrates through the conventional polyethylene containers and causes remarkable oxidation on the surface of the IC-wafer. Consequently, the oxidized surface requires further treatment such as chemical or abrasion treatment.

Friction between the IC-wafer and the resin during transportation produces abraded particulates and dust of the resin and results in problems such as adhesion of foreign particulates on the surface of the IC-wafer.

SUMMARY OF THE INVENTION

The present invention overcomes the problems and disadvantage of the prior art by providing a container for storing an IC-wafer which eliminates the need for re-treatment of the wafer surface and prevents generation of abraded particulates and dust of the resin.

An object of this invention is to provide a method for storing an IC-wafer.

An additional object of the invention is to provide a container for an IC-wafer that imparts excellent antioxidant properties to the wafer.

Additional objects and advantages of the invention will be set forth in part in the description which follows, and in part will be obvious from the description, or may be learned by practice of the invention. The objects and advantages of the invention will be realized and attained by means of the instrumentalities and combinations, particularly pointed out in the appended claims.

To achieve the objects and in accordance with the purpose of the invention, as embodied and broadly described herein, the invention provides a container for an integrated circuit wafer comprising (a) a recessed tray shaped member for holding and (b) a complementary sheet member proportionately sized to attach to and cover said recess; at least one member being made from a material selected from the group consisting of a single layer of at least one high-nitrile resin, and a laminated layer of at least one thermoplastic resin and at least one gas barrier resin.

The invention also provides a method for storing an IC-wafer comprising placing said wafer in the containers of the invention in the presence of an inert gas.

BRIEF DESCRIPTION OF THE DRAWINGS

In FIGS. 1–4, 1 is the complementary sheet member and 2 is the recessed tray-shaped member.

DESCRIPTION OF THE PREFERRED EMBODIMENTS

Figure 1:
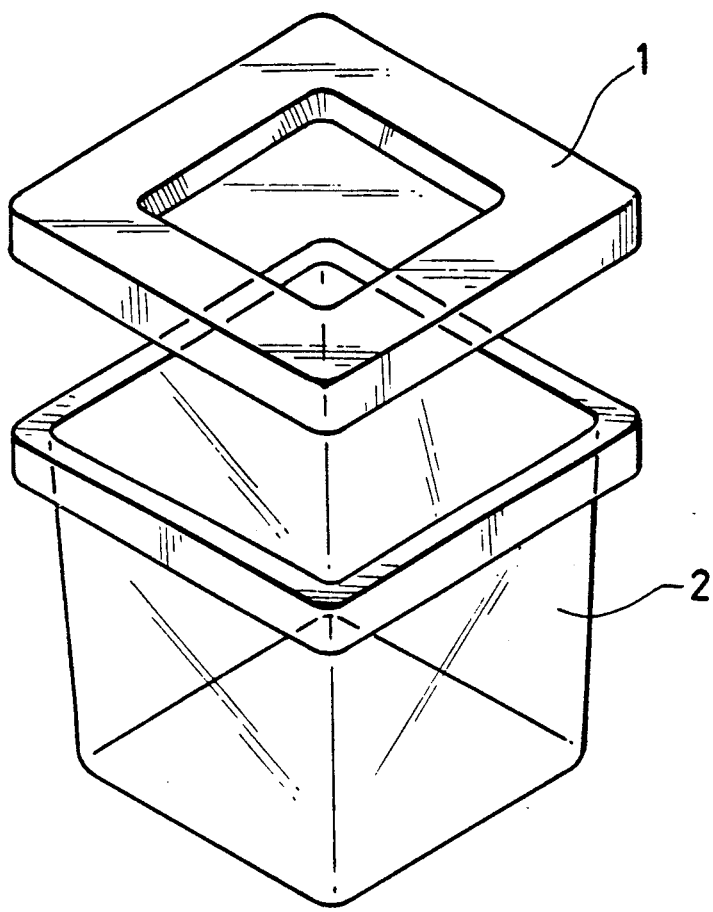
FIG. 1 is an oblique projection illustrating an example of the claimed container for an integrated circuit wafer comprising a recessed tray-shaped member and a complementary sheet member.
Figure 2:
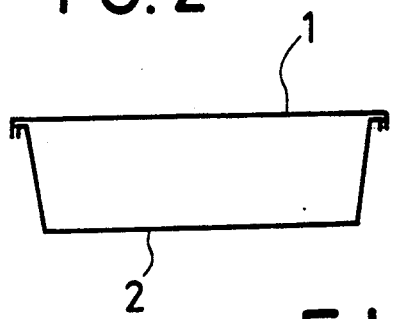
FIGS. 2–4 are examples of modifications of the container of the invention.
Figure 3:
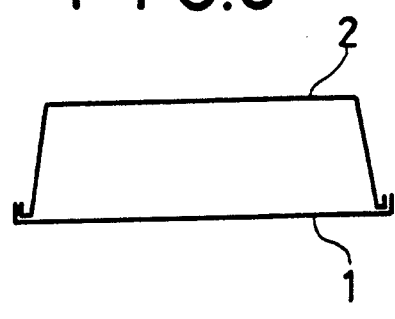
Figure 4:
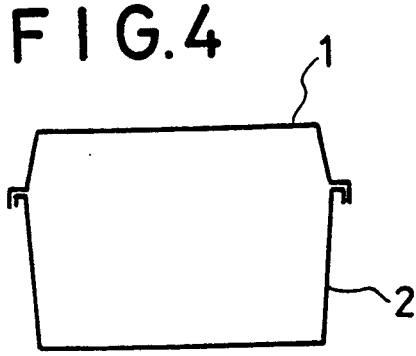

Reference will now be made in detail to the present preferred embodiments of the invention.

Preferably, the gas barrier resin is selected from the group consisting of high nitrile resins, polyvinylidene chloride resins, ethylene vinyl alcohol copolymer and a polyvinyl alcohol resins.

Preferably, of the container is made from a high-nitrile resin. Preferably, the high nitrile resin is prepared by polymerizing an acrylonitrile monomer with a copolymerizable monomer in the presence of a conjugated diene polymer.

In order to enhance the safety of the container of the invention, preferably, a resin having a hardness D of 70 in accordance with ASTM D-2240 is employed on the surface of the container that directly contacts the IC-wafer. It has been found that when a resin having a hardness D of less than 70 is used to form the portion of the container that may contact the IC-wafer, adhesion of generated foreign particles to the IC-wafer often occur as a result of abrasion between the resin and IC-wafer during transport.

The container of the invention imparts excellent antioxidant properties to the IC-wafer, prevents the generation of abraded particulates of the resin and protects against dust adhesion to the wafer and hence markedly contributes to improving operating efficiency during IC production.

Exemplary suitable gas barrier resins for use in the invention include high-nitrile resins, polyvinylidene chloride resins, ethylene vinyl alcohol copolymers and polyvinyl alcohol resins. Due to their moldability, such as ease of deep draw forming in thermo-forming process, high-nitrile resins are preferred. High-nitrile resins can be used singly. However when resins such as polyvinylidene chloride resins, ethylene vinyl alcohol copolymers and polyvinyl alcohol resins are employed, such resins are laminated with another thermoplastic resin. When the laminated material is used on the surface of the container, the resin having a hardness D of less than 70 often causes adhesion of generated foreign particulates to the IC-wafer as a result of abrasion between the resin and IC-wafer during transport. It is hence unfavorable to use the resin. On the other hand, a high-nitrile resin does not lead to the problem.

Exemplary high-nitrile resins suitable for use in the invention include copolymers primarily consisting of unsaturated nitrile monomers such as acrylonitrile and methacrylonitrile. The content of unsaturated nitrile monomers in the copolymer is preferably at least 50% by weight, more preferably at least 55% by weight.

Exemplary monomers that can copolymerize with unsaturated nitrile monomers include styrene, butadiene, isoprene, methyl acrylate, ethyl acrylate, methyl methacrylate and ethyl methacrylate. At least one of these monomers is copolymerized with the unsaturated nitrile monomers.

Other high-nitrile resins which can also be used in the invention include a mixture of the above copolymer with rubber-like polymers such as butadiene-acrylonitrile copolymers, isoprene-acrylonitrile copolymers, butadiene-styrene copolymers, polybutadiene and polyisoprene, and graft copolymers obtained by conducting graft polymerization of an unsaturated nitrile monomer and the above copolymerizable monomer in the presence of rubber-like polymers. It is particularly preferred to use a copolymer having at least 50% by weight acrylonitrile content which is obtained by polymerizing a mixture consisting of a large amount of acrylonitrile monomer and a monomer copolymerizable with said acrylonitrile monomer in the presence of a conjugated diene polymer. Such a copolymer is well balanced in processability and impact resistance, and also has good gas barrier properties.

Applicants have found that the use of a copolymer having an unsaturated nitrile monomer content of less than 50% by weight is unfavorable because the oxygen barrier property may be insufficient and the surface of IC-wafer may be oxidized.

An exemplary high-nitrole resin, BALEX ™ (a product of Mitsui Toatsu Chemicals Inc.), has an oxygen permeability of 20 $cc/m^2.atm.24$ hr in accordance with ASTM D1434-66 under the condition of 25 $\mu$ thickness. The oxygen permeability of polyvinylidene chloride resin is approximately 24 $cc/m^2.atm.24$ hr. The oxygen permeability of polyvinyl chloride is approximately 80–300 $cc/m^2. atm.24.hr$. The oxygen permeability of nylon is 2900–7900 $cc/m^2.atm.24.hr$, and the oxygen permeability of polypropyrene is 1700–2900 $cc/m^2.atm.24$ hr.

The container of the invention may be prepared, for example, from a sheet obtained by molding a high-nitrile resin through common processing methods such as T-die extrusion, calendering and inflation or from a sheet obtained by laminating a thermoplastic resin with a polyvinylidene chloride resin, an ethylene vinyl alcohol copolymer and/or a polyvinyl alcohol resin. These sheets are molded by thermo-forming processes such as vacuum forming and pressure forming. The container can also be prepared by directly subjecting the resin to injection molding.

When a high-nitrile resin is used, deep-draw forming can be carried out with ease and arbitrarily shaped products can be produced. When a polyvinylidene chloride resin, ethylene vinyl alcohol copolymer or polyvinyl alcohol resin are used by laminating the same with at least one other thermoplastic resin, the layer of polyvinylidene chloride resin, ethylene vinyl alcohol copolymer or polyvinyl alcohol resin is apt to partially decrease its thickness or to cause cracks in the deep-draw forming or in the molding of complex shapes. Consequently, a step for evaluating gas-barrier properties of the thermo-formed products is required, thereby lowering the yield of products.

The shape of the container provided by this invention can be freely selected according to the intended use. The container of the invention comprises a tray-shaped member and a cover member. The IC-wafer is generally encased in the tray-shaped member which is obtained by thermo-forming, and the cover member which in the form of a film or sheet is placed on the tray-shaped member. Both members may be combined by heat sealing, impulse sealing or other methods known to those of ordinary skill in this art. Thus, it is preferred to use a resin having good sealing properties. A sheet or film may be used as the bottom member which is connected with a tray-shaped cover member.

The container of the invention may be of any shape, for example, circular, square and hexagonal. The numbers of the IC-wafers encased in the container may vary from several pieces to several hundred pieces. For example, a suitable container for encasing one unit of 25 pieces of 4 inch wafers has dimensions of about $17 \times 17 \times 17$ cm. A container for encasing 6 units has dimensions of about $35 \times 53 \times 17$ cm. The wafer is set in a proper jig or fixture and encased.

The wall thickness of the container varies depending upon the number of IC-wafers encased in the container and the strength of the container required. Generally, the thickness is from about 0.1 to about 10 mm, preferably from about 0.2 to about 5 mm. Applicants have found that a thickness of less than 0.1 mm tends to cause insufficient rigidity of the container. On the other hand, the thickness may exceed 10 mm, however, such thickness is unfavorable due to the increase in weight, poor workability of such a container and the resultant cost increase.

In the process of the invention, the IC-wafer is encased in the container of the invention. The interior of the container is filled with at least one inert gas selected from the group consisting of nitrogen, carbon dioxide, helium and argon or is sealed in the presence of an oxygen absorber. A substantially oxygen free atmosphere can thus be established in the interior of the container. The IC-wafer is more effectively protected from oxidation by the process of the invention and thus it is not necessary to further treat the IC-wafer by chemical or abrasion treatment. The above inert gas may be used simultaneously with an oxygen absorber.

The phrase "substantially oxygen free atmosphere" as used herein means a state wherein the surface of an IC-wafer encased in the container of the invention is not oxidized by the oxygen. The preferred concentration of oxygen in the atmosphere is about 2% or less, more preferably the oxygen concentration is about 1% or less. The combination of oxygen and a drying agent is also preferred for storage.

The present invention will be further clarified by the following examples, which are intended to be purely exemplary of the invention.

Example 1

In the presence of 10 parts by weight of a butadiene-acrylonitrile rubber-like copolymer having a butadiene content of 70% by weight, a mixture of 75 parts by weight acrylonitrile and 25 parts by weight methyl methacrylate was polymerized by an emulsion polymerization process. The high-nitrile resin thus obtained had an acrylonitrile content of about 70% by weight according to nitrogen analysis and a hardness of 90 in accordance with ASTM D-2240. The resin was extruded to form a sheet having a thickness of 5 mm. The sheet was subjected to vacuum forming to prepare a tray-shaped member having a depth of 15 cm and an oxygen permeability of 2 cc/atm.24 hr. A cover member was separately prepared from a high-nitrile resin film having a thickness of 40 μm and an oxygen permeability of 10 cc/m².atm.24 hr.

In the container thus prepared, a 4 inch mirror wafer was encased, the interior of the container was replaced with nitrogen gas to lower the oxygen content to 1% and then the tray and cover members were heat sealed. The sealed package was subjected to a transport test in a truck for a distance of 500 km. The container was opened after a month. Oxidation and adhesion of foreign particulates were measured on the surface of the wafer. The results of oxidation are illustrated in Table 1 and the results of foreign particulate adhesion are illustrated in Table 2.

Example 2

The same procedures as described in Example 1 were carried out except that in the presence of 10 parts by weight of a butadiene-acrylonitrile rubber-like copolymer having a butadiene content of 80% by weight, a mixture of 70 parts by weight acrylonitrile, 15 parts by weight methyl methacrylate and 5 parts by weight styrene was polymerized to obtain a high-nitrile resin having an acrylonitrile content of about 65% by weight and a hardness of 85. The tray had an oxygen permeability of 3 cc/atm.24 hr. The results are illustrated in Table 1 and Table 2.

Example 3

The procedures of Example 1 were repeated except that sealing was carried out in the presence of an oxygen absorber Ageless SS$^{TM}$ (a product of Mitsubishi Gas Chemicals Inc.) in place of nitrogen substitution. The tray had an oxygen permeability of 2 cc/atm.24 hr. The results are illustrated in Table 1 and Table 2.

Example 4

The same procedures as described in Example 1 were carried out except that a sheet obtained by laminating a layer of polypropylene having a hardness D of 75 in accordance with ASTM D-2240 with a layer of polyvinylidene chloride was used. The tray had an oxygen permeability of 2 cc/atm.24 hr. The results were illustrated in Table 1 and Table 2.

Comparative Example 1

The procedures of Example 1 were repeated except that polyethylene having a hardness of 60 was used as the resin. The tray had an oxygen permeability of 7000 cc/atm.24 hr. The results are illustrated in Table 1 and Table 2.

Comparative Example 2

The same procedures as described in Example 1 were carried out except that a rigid polyvinyl chloride resin having a hardness of 80 was used as the sheet. The tray had an oxygen permeability of 2,000 cc/atm.24 hr. The results are illustrated in Table 1 and Table 2.

Other embodiments of the invention will be apparent to the skilled in the art from consideration of the specification and practice of the invention disclosed herein. It is intended that the specification and examples be considered as exemplary only, with a true scope and spirit of the invention being indicated by the following claims.

TABLE 1

|  | C | N | O | Si |
| --- | --- | --- | --- | --- |
| Reference | 73564 | 3277 | 9521 | 603120 |
| Example 1 | 75351 | 3742 | 10200 | 600290 |
| Example 2 | 77530 | 3921 | 9857 | 598780 |
| Example 3 | 76520 | 3845 | 9657 | 608780 |
| Example 4 | 74200 | 3850 | 11251 | 589350 |
| Comparative Example 1 | 90837 | 4230 | 409420 | 303100 |
| Comparative Example 2 | 90912 | 4513 | 71563 | 29802 |

Note:
Numerical value indicates spectral area of each element.
Measuring condition:
Device; ESCA. LAD. MKII a product of VG Co.
X ray source; Mg-Kα
X-ray output; 300 W
Degree of vacuum; less than $3 \times 10^{-9}$ m bar

TABLE 2

|  | Size of particulates and numbers of adhesion | | | |
| --- | --- | --- | --- | --- |
|  | 0.2–0.3 (μm) | 0.3–0.4 (μm) | 0.4–2 (μm) | 2 μm and more |
| Reference | 55 | 24 | 7 | 5 |
| Example 1 | 61 | 23 | 6 | 4 |
| Example 2 | 63 | 29 | 7 | 5 |
| Example 3 | 55 | 28 | 7 | 4 |
| Example 4 | 106 | 62 | 13 | 10 |
| Comparative Example 1 | 412 | 57 | 23 | 15 |
| Comparative Example 2 | 58 | 35 | 7 | 5 |

Note:
Measurement was carried out in a clean room having a cleaness degree of class 1000.
Device; Laser surface inspector HLD 300B a product of Hitachi Electronics Engineering Co.

We claim:

1. A method for storing an integrated circuit wafer comprising engaging a tray-shaped member and a complimentary sheet member to form a closed container comprising:
   (a) providing a tray-shaped member having a recess for holding said wafer; and
   (b) providing a complimentary sheet member proportionately sized to attach to and cover said recess;
   at least one of said tray-shaped member and said complimentary sheet member being made from a material selected from the group consisting of a single layer of at least one high-nitrile resin and a laminated layer of at least one thermoplastic resin and at least one gas barrier resin; and the surface of the container that may contact the integrated circuit wafer has an ASTM-D-2240 resin hardness of at least about 70;
   placing the integrated circuit wafer in the container, adding an inert gas to the container and storing the integrated circuit wafer in the container in the presence of the inert gas which has been added to the container.

2. The method of claim 1 wherein said high-nitrile resin has an ASTM D14340-66 oxygen permeability of 20 cc/m².atm.24 hr.

3. The method of claim 1 wherein said gas barrier resin is selected from the group consisting of a high-nitrile resin, a polyvinylidene chloride resin, an ethylene vinyl alcohol copolymer and a polyvinyl alcohol resin.

4. The method of claim 1 wherein said high-nitrile resin is a copolymer containing unsaturated nitrile monomers.

5. The method of claim 4 wherein said copolymer contains at least about 50% by weight unsaturated nitrile monomers.

6. The method of claim 4 wherein said copolymer contains at least about 50% by weight acrylonitrile.

7. The method of claim 1 wherein said high-nitrile resin is a copolymer of at least one unsaturated nitrile monomer and a monomer selected from the group consisting of styrene, butadiene, isoprene, methyl acrylate, ethyl acrylate, methyl methacrylate and ethyl methacrylate.

* * * * *

UNITED STATES PATENT AND TRADEMARK OFFICE
CERTIFICATE OF CORRECTION

PATENT NO. : 5,036,646

DATED : August 6, 1991

INVENTOR(S) : MAKIHARA ET AL.

It is certified that error appears in the above-identified patent and that said Letters Patent is hereby corrected as shown below:

Column 8, line 10, after claim 7, add the following claims:

--8. The method of claim 1 wherein at least one of said tray-shaped member and said complimentary sheet member is made from a high-nitrile resin.

9. The method of claim 1 wherein said members are engaged by heat sealing.--

Signed and Sealed this

Sixth Day of April, 1993

Attest:

STEPHEN G. KUNIN

Attesting Officer

Acting Commissioner of Patents and Trademarks